United States Patent
Schwindt (10) Patent No.: US 7,504,842 B2
(45) Date of Patent: Mar. 17, 2009

(54) PROBE HOLDER FOR TESTING OF A TEST DEVICE

(75) Inventor: Randy Schwindt, New Milford, CT (US)

(73) Assignee: Cascade Microtech, Inc., Beaverton, OR (US)

(*) Notice: Subject to any disclaimer, the term of this patent is extended or adjusted under 35 U.S.C. 154(b) by 0 days.

(21) Appl. No.: 11/786,633

(22) Filed: Apr. 11, 2007

(65) Prior Publication Data

US 2007/0194803 A1    Aug. 23, 2007

Related U.S. Application Data

(60) Continuation of application No. 11/406,737, filed on Apr. 18, 2006, now Pat. No. 7,221,174, which is a continuation of application No. 10/954,496, filed on Sep. 29, 2004, now Pat. No. 7,057,407, which is a continuation of application No. 10/278,313, filed on Oct. 22, 2002, now Pat. No. 6,850,082, which is a continuation of application No. 10/086,331, filed on Mar. 1, 2002, now Pat. No. 6,496,024, which is a continuation of application No. 09/815,182, filed on Mar. 22, 2001, now Pat. No. 6,384,615, which is a division of application No. 08/864,287, filed on May 28, 1997, now Pat. No. 6,232,789.

(51) Int. Cl.
*G01R 1/06* (2006.01)

(52) U.S. Cl. .................................. 324/754; 324/762

(58) Field of Classification Search ......... 324/754–762, 324/72.5, 133; 439/482, 824; 174/68.1, 174/72, 103, 107

See application file for complete search history.

(56) References Cited

U.S. PATENT DOCUMENTS

| | | |
|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |

(Continued)

FOREIGN PATENT DOCUMENTS

CH    607 045    11/1978

(Continued)

OTHER PUBLICATIONS

The Micromanipulator Company, data sheet, Double Sided Probing System, Jul. 2002, 2 pages.

(Continued)

*Primary Examiner*—Vinh P Nguyen
(74) *Attorney, Agent, or Firm*—Chernoff, Vilhauer, McClung & Stenzel (57) ABSTRACT

A system for low-current testing of a test device includes a probing device for probing a probing site on the test device. The probing device includes a dielectric substrate having first and second sides, an elongate conductive path on the first side of the substrate, an elongate probing element connected to the elongate conductive path so as to extend in a cantilevered manner beyond the substrate, and a conductive area on the second side of the substrate. The probe housing is matingly detachably engageable with the probing device.

12 Claims, 3 Drawing Sheets

U.S. PATENT DOCUMENTS

| | | |
|---|---|---|
| 2,762,234 A | 9/1956 | Dodd |
| 2,901,696 A | 8/1959 | Möllfors |
| 2,921,276 A | 1/1960 | Fubini |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |

| | | | | | | |
|---|---|---|---|---|---|---|
| 4,696,544 A | 9/1987 | Costella | | 4,975,638 A | 12/1990 | Evans et al. |
| 4,697,143 A | 9/1987 | Lockwood et al. | | 4,980,637 A | 12/1990 | Huff et al. |
| 4,705,447 A | 11/1987 | Smith | | 4,980,638 A | 12/1990 | Dermon et al. |
| 4,706,050 A | 11/1987 | Andrews | | 4,983,910 A | 1/1991 | Majidi-Ahy et al. |
| 4,707,657 A | 11/1987 | Bøegh-Petersen | | 4,987,100 A | 1/1991 | McBride et al. |
| 4,711,563 A | 12/1987 | Lass | | 4,988,062 A | 1/1991 | London |
| 4,713,347 A | 12/1987 | Mitchell et al. | | 4,991,290 A | 2/1991 | MacKay |
| 4,714,873 A | 12/1987 | McPherson et al. | | 4,998,062 A | 3/1991 | Ikeda |
| 4,725,793 A | 2/1988 | Igarashi | | 4,998,063 A | 3/1991 | Miller |
| 4,727,319 A | 2/1988 | Shahriary | | 5,001,423 A | 3/1991 | Abrami et al. |
| 4,727,391 A | 2/1988 | Tajima et al. | | 5,003,253 A | 3/1991 | Majidi-Ahy et al. |
| 4,727,637 A | 3/1988 | Buckwitz et al. | | 5,012,186 A | 4/1991 | Gleason |
| 4,734,641 A | 3/1988 | Byrd, Jr. et al. | | 5,020,219 A | 6/1991 | Leedy |
| 4,739,259 A | 4/1988 | Hadwin et al. | | 5,021,186 A | 6/1991 | Ota et al. |
| 4,740,764 A | 4/1988 | Gerlack | | 5,030,907 A | 7/1991 | Yih et al. |
| 4,742,571 A | 5/1988 | Letron | | 5,041,782 A | 8/1991 | Marzan |
| 4,744,041 A | 5/1988 | Strunk et al. | | 5,045,781 A | 9/1991 | Gleason et al. |
| 4,746,857 A | 5/1988 | Sakai et al. | | 5,059,898 A | 10/1991 | Barsotti et al. |
| 4,749,942 A | 6/1988 | Sang et al. | | 5,061,192 A | 10/1991 | Chapin et al. |
| 4,754,239 A | 6/1988 | Sedivec | | 5,061,823 A | 10/1991 | Carroll |
| 4,755,746 A | 7/1988 | Mallory et al. | | 5,066,357 A | 11/1991 | Smyth, Jr. et al. |
| 4,755,747 A | 7/1988 | Sato | | 5,069,628 A | 12/1991 | Crumly |
| 4,755,874 A | 7/1988 | Esrig et al. | | 5,082,627 A | 1/1992 | Stanbro |
| 4,757,255 A | 7/1988 | Margozzi | | 5,084,671 A | 1/1992 | Miyata et al. |
| 4,764,723 A | 8/1988 | Strid | | 5,089,774 A | 2/1992 | Nakano |
| 4,766,384 A | 8/1988 | Kleinberg et al. | | 5,091,692 A | 2/1992 | Ohno et al. |
| 4,772,846 A | 9/1988 | Reeds | | 5,091,732 A | 2/1992 | Mileski et al. |
| 4,780,670 A | 10/1988 | Cherry | | 5,095,891 A | 3/1992 | Reitter |
| 4,783,625 A | 11/1988 | Harry et al. | | 5,097,101 A | 3/1992 | Trobough |
| 4,788,851 A | 12/1988 | Brault | | 5,097,207 A | 3/1992 | Blanz |
| 4,791,363 A | 12/1988 | Logan | | 5,101,453 A | 3/1992 | Rumbaugh |
| 4,793,814 A | 12/1988 | Zifcak et al. | | 5,107,076 A | 4/1992 | Bullock et al. |
| 4,795,962 A | 1/1989 | Yanagawa et al. | | 5,116,180 A | 5/1992 | Fung et al. |
| 4,805,627 A | 2/1989 | Klingenbeck et al. | | 5,126,286 A | 6/1992 | Chance |
| 4,810,981 A | 3/1989 | Herstein | | 5,126,696 A | 6/1992 | Grote et al. |
| 4,812,754 A | 3/1989 | Tracy et al. | | 5,133,119 A | 7/1992 | Afshari et al. |
| 4,818,059 A | 4/1989 | Kakii et al. | | 5,134,365 A | 7/1992 | Okubo et al. |
| 4,827,211 A | 5/1989 | Strid et al. | | 5,136,237 A | 8/1992 | Smith et al. |
| 4,831,494 A | 5/1989 | Arnold et al. | | 5,138,289 A | 8/1992 | McGrath |
| 4,835,495 A | 5/1989 | Simonutti | | 5,142,224 A | 8/1992 | Smith et al. |
| 4,837,507 A | 6/1989 | Hechtman | | 5,145,552 A | 9/1992 | Yoshizawa et al. |
| 4,839,587 A | 6/1989 | Flatley et al. | | 5,148,131 A | 9/1992 | Amboss et al. |
| 4,849,689 A | 7/1989 | Gleason et al. | | 5,159,264 A | 10/1992 | Anderson |
| 4,853,624 A | 8/1989 | Rabjohn | | 5,159,267 A | 10/1992 | Anderson |
| 4,853,627 A | 8/1989 | Gleason et al. | | 5,159,752 A | 11/1992 | Mahant-Shetti et al. |
| 4,858,160 A | 8/1989 | Strid et al. | | 5,160,883 A | 11/1992 | Blanz |
| 4,859,989 A | 8/1989 | McPherson | | 5,164,319 A | 11/1992 | Hafeman et al. |
| 4,864,227 A | 9/1989 | Sato | | 5,166,606 A | 11/1992 | Blanz |
| 4,871,883 A | 10/1989 | Guiol | | 5,172,049 A | 12/1992 | Kiyokawa et al. |
| 4,871,964 A | 10/1989 | Boll et al. | | 5,172,050 A | 12/1992 | Swapp |
| 4,888,550 A | 12/1989 | Reid | | 5,172,051 A | 12/1992 | Zamborelli |
| 4,891,584 A | 1/1990 | Kamieniecki et al. | | 5,177,438 A | 1/1993 | Littlebury et al. |
| 4,893,914 A | 1/1990 | Hancock et al. | | 5,180,977 A | 1/1993 | Huff |
| 4,894,612 A | 1/1990 | Drake et al. | | 5,187,443 A | 2/1993 | Bereskin |
| 4,899,126 A | 2/1990 | Yamada | | 5,198,752 A | 3/1993 | Miyata et al. |
| 4,899,998 A | 2/1990 | Feramachi | | 5,198,753 A | 3/1993 | Hamburgen |
| 4,901,012 A | 2/1990 | Gloanec et al. | | 5,202,558 A | 4/1993 | Barker |
| 4,904,933 A | 2/1990 | Snyder et al. | | 5,202,648 A | 4/1993 | McCandless |
| 4,904,935 A | 2/1990 | Calma et al. | | 5,207,585 A | 5/1993 | Byrnes et al. |
| 4,906,920 A | 3/1990 | Huff et al. | | 5,214,243 A | 5/1993 | Johnson |
| 4,908,570 A | 3/1990 | Gupta et al. | | 5,214,374 A | 5/1993 | St. Onge |
| 4,912,399 A | 3/1990 | Greub et al. | | 5,225,037 A | 7/1993 | Elder et al. |
| 4,916,002 A | 4/1990 | Carver | | 5,227,730 A | 7/1993 | King et al. |
| 4,916,398 A | 4/1990 | Rath | | 5,232,789 A | 8/1993 | Platz et al. |
| 4,918,373 A | 4/1990 | Newberg | | 5,233,197 A | 8/1993 | Bowman et al. |
| 4,918,383 A | 4/1990 | Huff et al. | | 5,233,306 A | 8/1993 | Misra |
| 4,922,128 A | 5/1990 | Dhong et al. | | 5,245,292 A | 9/1993 | Milesky et al. |
| 4,922,186 A | 5/1990 | Tsuchiya et al. | | 5,266,889 A | 11/1993 | Harwood et al. |
| 4,922,912 A | 5/1990 | Watanabe | | 5,266,963 A | 11/1993 | Carter |
| 4,926,172 A | 5/1990 | Gorsek | | 5,267,088 A | 11/1993 | Nomura |
| 4,929,893 A | 5/1990 | Sato et al. | | 5,270,664 A | 12/1993 | McMurtry et al. |
| 4,970,386 A | 11/1990 | Buck | | 5,274,336 A | 12/1993 | Crook et al. |
| 4,972,073 A | 11/1990 | Lessing | | 5,280,156 A | 1/1994 | Niori et al. |

| Patent | Date | Inventor |
|---|---|---|
| 5,289,117 A | 2/1994 | Van Loan et al. |
| 5,293,175 A | 3/1994 | Hemmie et al. |
| 5,298,972 A | 3/1994 | Heffner |
| 5,304,924 A | 4/1994 | Yamano et al. |
| 5,313,157 A | 5/1994 | Pasiecznik, Jr. |
| 5,315,237 A | 5/1994 | Iwakura et al. |
| 5,316,435 A | 5/1994 | Mozingo |
| 5,317,656 A | 5/1994 | Moslehi et al. |
| 5,321,352 A | 6/1994 | Takebuchi |
| 5,321,453 A | 6/1994 | Mori et al. |
| 5,326,412 A | 7/1994 | Schreiber et al. |
| 5,334,931 A | 8/1994 | Clarke et al. |
| 5,347,204 A | 9/1994 | Gregory et al. |
| 5,355,079 A | 10/1994 | Evans et al. |
| 5,357,211 A | 10/1994 | Bryson et al. |
| 5,360,312 A | 11/1994 | Mozingo |
| 5,361,049 A | 11/1994 | Rubin et al. |
| 5,363,050 A | 11/1994 | Guo et al. |
| 5,367,165 A | 11/1994 | Toda et al. |
| 5,369,368 A | 11/1994 | Kassen et al. |
| 5,371,654 A | 12/1994 | Beaman et al. |
| 5,373,231 A | 12/1994 | Boll et al. |
| 5,374,938 A | 12/1994 | Hatazawa et al. |
| 5,376,790 A | 12/1994 | Linker et al. |
| 5,383,787 A | 1/1995 | Switky et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,430,813 A | 7/1995 | Anderson et al. |
| 5,441,690 A | 8/1995 | Ayala-Esquilin et al. |
| 5,451,884 A | 9/1995 | Sauerland |
| 5,453,404 A | 9/1995 | Leedy |
| 5,457,398 A | 10/1995 | Schwindt et al. |
| 5,463,324 A | 10/1995 | Wardwell et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,488,954 A | 2/1996 | Sleva et al. |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,507,652 A | 4/1996 | Wardwell |
| 5,510,792 A | 4/1996 | Ono et al. |
| 5,511,010 A | 4/1996 | Burns |
| 5,512,835 A | 4/1996 | Rivera et al. |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,528,158 A | 6/1996 | Sinsheimer et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,539,323 A | 7/1996 | Davis, Jr. |
| 5,539,676 A | 7/1996 | Yamaguchi |
| 5,550,481 A | 8/1996 | Holmes et al. |
| 5,561,378 A | 10/1996 | Bockelman et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,578,932 A | 11/1996 | Adamian |
| 5,583,445 A | 12/1996 | Mullen |
| 5,584,120 A | 12/1996 | Roberts |
| 5,584,608 A | 12/1996 | Gillespie |
| 5,589,781 A | 12/1996 | Higgins et al. |
| 5,594,358 A | 1/1997 | Ishikawa et al. |
| 5,600,256 A | 2/1997 | Woith et al. |
| 5,601,740 A | 2/1997 | Eldridge et al. |
| 5,610,529 A | 3/1997 | Schwindt |
| 5,611,008 A | 3/1997 | Yap |
| 5,617,035 A | 4/1997 | Swapp |
| 5,621,333 A | 4/1997 | Long et al. |
| 5,621,400 A | 4/1997 | Corbi |
| 5,623,213 A | 4/1997 | Liu et al. |
| 5,623,214 A | 4/1997 | Pasiecznik, Jr. |
| 5,627,473 A | 5/1997 | Takami |
| 5,628,057 A | 5/1997 | Phillips et al. |
| 5,629,838 A | 5/1997 | Knight et al. |
| 5,631,571 A | 5/1997 | Spaziani et al. |
| 5,633,780 A | 5/1997 | Cronin |
| 5,635,846 A | 6/1997 | Beaman et al. |
| 5,642,298 A | 6/1997 | Mallory et al. |
| 5,644,248 A | 7/1997 | Fujimoto |
| 5,653,939 A | 8/1997 | Hollis et al. |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,678,210 A | 10/1997 | Hannah |
| 5,685,232 A | 11/1997 | Inoue |
| 5,686,317 A | 11/1997 | Akram et al. |
| 5,686,960 A | 11/1997 | Sussman et al. |
| 5,688,618 A | 11/1997 | Hulderman et al. |
| 5,700,844 A | 12/1997 | Hedrick et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Hirano et al. |
| 5,726,211 A | 3/1998 | Hedrick et al. |
| 5,728,091 A | 3/1998 | Payne et al. |
| 5,729,150 A | 3/1998 | Schwindt |
| 5,731,920 A | 3/1998 | Katsuragawa |
| 5,742,174 A | 4/1998 | Kister et al. |
| 5,744,971 A | 4/1998 | Chan et al. |
| 5,748,506 A | 5/1998 | Bockelman |
| 5,751,153 A | 5/1998 | Bockelman |
| 5,751,252 A | 5/1998 | Phillips |
| 5,756,021 A | 5/1998 | Bedrick et al. |
| 5,756,908 A | 5/1998 | Knollmeyer et al. |
| 5,764,070 A | 6/1998 | Pedder |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,792,668 A | 8/1998 | Fuller et al. |
| 5,793,213 A | 8/1998 | Bockelman et al. |
| 5,794,133 A | 8/1998 | Kashima |
| 5,803,607 A | 9/1998 | Jones et al. |
| 5,804,607 A | 9/1998 | Hedrick et al. |

| | | | | | |
|---|---|---|---|---|---|
| 5,804,982 A | 9/1998 | Lo et al. | 5,998,768 A | 12/1999 | Hunter et al. |
| 5,804,983 A | 9/1998 | Nakajima et al. | 5,998,864 A | 12/1999 | Khandros et al. |
| 5,806,181 A | 9/1998 | Khandros et al. | 5,999,268 A | 12/1999 | Yonezawa et al. |
| 5,807,107 A | 9/1998 | Bright et al. | 6,001,760 A | 12/1999 | Katsuda et al. |
| 5,810,607 A | 9/1998 | Shih et al. | 6,002,426 A | 12/1999 | Back et al. |
| 5,811,751 A | 9/1998 | Leona et al. | 6,006,002 A | 12/1999 | Motok et al. |
| 5,811,982 A | 9/1998 | Beaman et al. | 6,013,586 A | 1/2000 | McGhee et al. |
| 5,813,847 A | 9/1998 | Eroglu et al. | 6,019,612 A | 2/2000 | Hasegawa et al. |
| 5,814,847 A | 9/1998 | Shihadeh et al. | 6,023,103 A | 2/2000 | Chang et al. |
| 5,820,014 A | 10/1998 | Dozier, II et al. | 6,028,435 A | 2/2000 | Nikawa |
| 5,821,763 A | 10/1998 | Beaman et al. | 6,029,344 A | 2/2000 | Khandros et al. |
| 5,824,494 A | 10/1998 | Feldberg | 6,031,383 A | 2/2000 | Streib et al. |
| 5,829,128 A | 11/1998 | Eldridge et al. | 6,032,356 A | 3/2000 | Eldridge et al. |
| 5,829,437 A | 11/1998 | Bridges | 6,032,714 A | 3/2000 | Fenton |
| 5,831,442 A | 11/1998 | Heigl | 6,033,935 A | 3/2000 | Dozier, II et al. |
| 5,832,601 A | 11/1998 | Eldridge et al. | 6,034,533 A | 3/2000 | Tervo et al. |
| 5,833,601 A | 11/1998 | Swartz et al. | 6,037,785 A | 3/2000 | Higgins |
| 5,838,160 A | 11/1998 | Beaman et al. | 6,040,739 A | 3/2000 | Wedeen et al. |
| 5,841,288 A | 11/1998 | Meaney et al. | 6,042,712 A | 3/2000 | Mathieu |
| 5,841,342 A | 11/1998 | Hegmann et al. | 6,043,563 A | 3/2000 | Eldridge et al. |
| 5,846,708 A | 12/1998 | Hollis et al. | 6,046,599 A | 4/2000 | Long et al. |
| 5,847,569 A | 12/1998 | Ho et al. | 6,049,216 A | 4/2000 | Yang et al. |
| 5,848,500 A | 12/1998 | Kirk | 6,049,976 A | 4/2000 | Khandros |
| 5,852,232 A | 12/1998 | Samsavar et al. | 6,050,829 A | 4/2000 | Eldridge et al. |
| 5,852,871 A | 12/1998 | Khandros | 6,051,422 A | 4/2000 | Kovacs et al. |
| 5,854,608 A | 12/1998 | Leisten | 6,052,653 A | 4/2000 | Mazur et al. |
| 5,864,946 A | 2/1999 | Eldridge et al. | 6,054,651 A | 4/2000 | Fogel et al. |
| 5,867,073 A | 2/1999 | Weinreb et al. | 6,054,869 A | 4/2000 | Hutton et al. |
| 5,869,326 A | 2/1999 | Hofmann | 6,059,982 A | 5/2000 | Palagonia et al. |
| 5,869,974 A | 2/1999 | Akram et al. | 6,060,888 A | 5/2000 | Blackham et al. |
| 5,874,361 A | 2/1999 | Collins et al. | 6,060,892 A | 5/2000 | Yamagata |
| 5,876,082 A | 3/1999 | Kempf et al. | 6,061,589 A | 5/2000 | Bridges et al. |
| 5,878,486 A | 3/1999 | Eldridge et al. | 6,062,879 A | 5/2000 | Beaman et al. |
| 5,879,289 A | 3/1999 | Yarush et al. | 6,064,213 A | 5/2000 | Khandros et al. |
| 5,883,522 A | 3/1999 | O'Boyle | 6,064,217 A | 5/2000 | Smith |
| 5,883,523 A | 3/1999 | Ferland et al. | 6,064,218 A | 5/2000 | Godfrey et al. |
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,567 A | 8/2000 | Kaplan et al. |
| 5,912,046 A | 6/1999 | Eldridge et al. | 6,100,815 A | 8/2000 | Pailthorp |
| 5,914,613 A | 6/1999 | Gleason et al. | 6,104,201 A | 8/2000 | Beaman et al. |
| 5,914,614 A | 6/1999 | Beaman et al. | 6,104,206 A | 8/2000 | Verkuil |
| 5,916,689 A | 6/1999 | Collins et al. | 6,110,823 A | 8/2000 | Eldridge et al. |
| 5,917,707 A | 6/1999 | Khandros et al. | 6,114,864 A | 9/2000 | Soejima et al. |
| 5,923,180 A | 7/1999 | Botka et al. | 6,114,865 A | 9/2000 | Lagowski et al. |
| 5,926,029 A | 7/1999 | Ference et al. | 6,118,287 A | 9/2000 | Boll et al. |
| 5,926,951 A | 7/1999 | Khandros et al. | 6,118,894 A | 9/2000 | Schwartz et al. |
| 5,940,965 A | 8/1999 | Uhling et al. | 6,121,836 A | 9/2000 | Vallencourt |
| 5,944,093 A | 8/1999 | Viswanath | 6,124,725 A | 9/2000 | Sato |
| 5,945,836 A | 8/1999 | Sayre et al. | 6,127,831 A | 10/2000 | Khoury et al. |
| 5,949,383 A | 9/1999 | Hayes et al. | 6,130,536 A | 10/2000 | Powell et al. |
| 5,949,579 A | 9/1999 | Baker | 6,137,302 A | 10/2000 | Schwindt |
| 5,959,461 A | 9/1999 | Brown et al. | 6,144,212 A | 11/2000 | Mizuta |
| 5,963,364 A | 10/1999 | Leong et al. | 6,146,908 A | 11/2000 | Falque et al. |
| 5,966,645 A | 10/1999 | Davis | 6,147,502 A | 11/2000 | Fryer et al. |
| 5,970,429 A | 10/1999 | Martin | 6,147,851 A | 11/2000 | Anderson |
| 5,973,504 A | 10/1999 | Chong | 6,150,186 A | 11/2000 | Chen et al. |
| 5,974,662 A | 11/1999 | Eldridge et al. | 6,160,407 A | 12/2000 | Nikawa |
| 5,977,783 A | 11/1999 | Takayama et al. | 6,166,553 A | 12/2000 | Sinsheimer |
| 5,981,268 A | 11/1999 | Kovacs et al. | 6,168,974 B1 | 1/2001 | Chang et al. |
| 5,982,166 A | 11/1999 | Mautz | 6,169,410 B1 | 1/2001 | Grace et al. |
| 5,983,493 A | 11/1999 | Eldridge et al. | 6,172,337 B1 | 1/2001 | Johnsgard et al. |
| 5,993,611 A | 11/1999 | Moroney, III et al. | 6,174,744 B1 | 1/2001 | Watanabe et al. |
| 5,994,152 A | 11/1999 | Khandros et al. | 6,175,228 B1 | 1/2001 | Zamborelli et al. |
| 5,995,914 A | 11/1999 | Cabot | 6,181,144 B1 | 1/2001 | Hembree et al. |
| 5,996,102 A | 11/1999 | Haulin | 6,181,149 B1 | 1/2001 | Godfrey et al. |
| 5,998,228 A | 12/1999 | Eldridge et al. | 6,181,297 B1 | 1/2001 | Leisten |

| Patent | Kind | Date | Inventor |
|---|---|---|---|
| 6,181,416 | B1 | 1/2001 | Falk |
| 6,184,053 | B1 | 2/2001 | Eldridge et al. |
| 6,184,587 | B1 | 2/2001 | Khandros et al. |
| 6,184,845 | B1 | 2/2001 | Leisten et al. |
| 6,191,596 | B1 | 2/2001 | Abiko |
| 6,194,720 | B1 | 2/2001 | Li et al. |
| 6,206,273 | B1 | 3/2001 | Beaman et al. |
| 6,208,225 | B1 | 3/2001 | Miller |
| RE37,130 | E | 4/2001 | Fiori, Jr. |
| 6,211,663 | B1 | 4/2001 | Moulthrop et al. |
| 6,211,837 | B1 | 4/2001 | Crouch et al. |
| 6,215,196 | B1 | 4/2001 | Eldridge et al. |
| 6,215,295 | B1 | 4/2001 | Smith, III |
| 6,215,670 | B1 | 4/2001 | Khandros |
| 6,218,910 | B1 | 4/2001 | Miller |
| 6,222,031 | B1 | 4/2001 | Wakabayashi et al. |
| 6,222,970 | B1 | 4/2001 | Wach et al. |
| 6,229,327 | B1 | 5/2001 | Boll et al. |
| 6,232,149 | B1 | 5/2001 | Dozier, II et al. |
| 6,232,787 | B1 | 5/2001 | Lo et al. |
| 6,232,788 | B1 | 5/2001 | Schwindt et al. |
| 6,232,789 | B1 | 5/2001 | Schwindt |
| 6,233,613 | B1 | 5/2001 | Walker et al. |
| 6,236,223 | B1 | 5/2001 | Brady et al. |
| 6,242,803 | B1 | 6/2001 | Khandros et al. |
| 6,242,929 | B1 | 6/2001 | Mizuta |
| 6,245,692 | B1 | 6/2001 | Pearce et al. |
| 6,246,247 | B1 | 6/2001 | Eldridge et al. |
| 6,251,595 | B1 | 6/2001 | Gordon et al. |
| 6,255,126 | B1 | 7/2001 | Mathieu et al. |
| 6,256,882 | B1 | 7/2001 | Gleason et al. |
| 6,257,564 | B1 | 7/2001 | Avneri et al. |
| 6,265,950 | B1 | 7/2001 | Schmidt et al. |
| 6,268,015 | B1 | 7/2001 | Mathieu et al. |
| 6,268,016 | B1 | 7/2001 | Bhatt et al. |
| 6,271,673 | B1 | 8/2001 | Furuta et al. |
| 6,274,823 | B1 | 8/2001 | Khandros et al. |
| 6,275,043 | B1 | 8/2001 | Mühlberger et al. |
| 6,275,738 | B1 | 8/2001 | Kasevich et al. |
| 6,278,051 | B1 | 8/2001 | Peabody |
| 6,278,411 | B1 | 8/2001 | Ohlsson et al. |
| 6,281,691 | B1 | 8/2001 | Matsunaga et al. |
| 6,286,208 | B1 | 9/2001 | Shih et al. |
| 6,292,760 | B1 | 9/2001 | Burns |
| 6,295,729 | B1 | 10/2001 | Beaman et al. |
| 6,300,775 | B1 | 10/2001 | Peach et al. |
| 6,300,780 | B1 | 10/2001 | Beaman et al. |
| 6,307,161 | B1 | 10/2001 | Grube et al. |
| 6,307,363 | B1 | 10/2001 | Anderson |
| 6,307,672 | B1 | 10/2001 | DeNure |
| 6,310,483 | B1 | 10/2001 | Taura et al. |
| 6,320,372 | B1 | 11/2001 | Keller |
| 6,320,396 | B1 | 11/2001 | Nikawa |
| 6,327,034 | B1 | 12/2001 | Hoover et al. |
| 6,329,827 | B1 | 12/2001 | Beaman et al. |
| 6,330,164 | B1 | 12/2001 | Khandros et al. |
| 6,332,270 | B2 | 12/2001 | Beaman et al. |
| 6,334,247 | B1 | 1/2002 | Beaman et al. |
| 6,335,625 | B1 | 1/2002 | Bryant et al. |
| 6,339,338 | B1 | 1/2002 | Eldridge et al. |
| 6,340,568 | B2 | 1/2002 | Hefti |
| 6,340,895 | B1 | 1/2002 | Uher et al. |
| 6,351,885 | B2 | 3/2002 | Suzuki et al. |
| 6,352,454 | B1 | 3/2002 | Kim et al. |
| 6,359,456 | B1 | 3/2002 | Hembree et al. |
| 6,362,792 | B1 | 3/2002 | Sawamura et al. |
| 6,366,247 | B1 | 4/2002 | Sawamura et al. |
| 6,369,776 | B1 | 4/2002 | Leisten et al. |
| 6,376,258 | B2 | 4/2002 | Hefti |
| 6,384,614 | B1 | 5/2002 | Hager et al. |
| 6,384,615 | B2 | 5/2002 | Schwindt |
| 6,388,455 | B1 | 5/2002 | Kamienecki et al. |
| 6,395,480 | B1 | 5/2002 | Hefti |
| 6,396,296 | B1 | 5/2002 | Tarter et al. |
| 6,396,298 | B1 | 5/2002 | Young et al. |
| 6,400,168 | B2 | 6/2002 | Matsunaga et al. |
| 6,404,213 | B2 | 6/2002 | Noda |
| 6,407,542 | B1 | 6/2002 | Conte |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,420,722 | B2 | 7/2002 | Moore et al. |
| 6,424,316 | B1 | 7/2002 | Leisten et al. |
| 6,429,029 | B1 | 8/2002 | Eldridge et al. |
| 6,441,315 | B1 | 8/2002 | Eldridge et al. |
| 6,442,831 | B1 | 9/2002 | Khandros et al. |
| 6,447,339 | B1 | 9/2002 | Reed et al. |
| 6,448,788 | B1 | 9/2002 | Meaney et al. |
| 6,448,865 | B1 | 9/2002 | Miller |
| 6,452,406 | B1 | 9/2002 | Beaman et al. |
| 6,452,411 | B1 | 9/2002 | Miller et al. |
| 6,456,099 | B1 | 9/2002 | Eldridge et al. |
| 6,456,103 | B1 | 9/2002 | Eldridge et al. |
| 6,459,343 | B1 | 10/2002 | Miller |
| 6,459,739 | B1 | 10/2002 | Vitenberg |
| 6,468,098 | B1 | 10/2002 | Eldridge |
| 6,475,822 | B2 | 11/2002 | Eldridge |
| 6,476,333 | B1 | 11/2002 | Khandros et al. |
| 6,476,442 | B1 | 11/2002 | Williams et al. |
| 6,476,630 | B1 | 11/2002 | Whitten et al. |
| 6,479,308 | B1 | 11/2002 | Eldridge |
| 6,480,013 | B1 | 11/2002 | Nayler et al. |
| 6,480,978 | B1 | 11/2002 | Roy et al. |
| 6,481,939 | B1 | 11/2002 | Gillespie et al. |
| 6,482,013 | B2 | 11/2002 | Eldridge et al. |
| 6,483,327 | B1 | 11/2002 | Bruce et al. |
| 6,488,405 | B1 | 12/2002 | Eppes et al. |
| 6,490,471 | B2 | 12/2002 | Svenson et al. |
| 6,491,968 | B1 | 12/2002 | Mathieu et al. |
| 6,496,024 | B2 | 12/2002 | Schwindt |
| 6,499,121 | B1 | 12/2002 | Roy et al. |
| 6,501,343 | B2 | 12/2002 | Miller |
| 6,509,751 | B1 | 1/2003 | Mathieu et al. |
| 6,512,482 | B1 | 1/2003 | Nelson et al. |
| 6,520,778 | B1 | 2/2003 | Eldridge et al. |
| 6,525,555 | B1 | 2/2003 | Khandros et al. |
| 6,526,655 | B2 | 3/2003 | Beaman et al. |
| 6,528,984 | B2 | 3/2003 | Beaman et al. |
| 6,528,993 | B1 | 3/2003 | Shin et al. |
| 6,529,844 | B1 | 3/2003 | Kapetanic et al. |
| 6,534,856 | B1 | 3/2003 | Dozier, II et al. |
| 6,538,214 | B2 | 3/2003 | Khandros |
| 6,538,538 | B2 | 3/2003 | Hreish et al. |
| 6,539,531 | B2 | 3/2003 | Miller et al. |
| 6,548,311 | B1 | 4/2003 | Knoll |
| 6,549,022 | B1 | 4/2003 | Cole, Jr. et al. |
| 6,549,106 | B2 | 4/2003 | Martin |
| 6,551,884 | B2 | 4/2003 | Masuoka |
| 6,559,671 | B2 | 5/2003 | Miller et al. |
| 6,566,079 | B2 | 5/2003 | Hefti |
| 6,572,608 | B1 | 6/2003 | Lee et al. |
| 6,573,702 | B2 | 6/2003 | Marcuse et al. |
| 6,578,264 | B1 | 6/2003 | Gleason et al. |
| 6,580,283 | B1 | 6/2003 | Carbone et al. |
| 6,582,979 | B2 | 6/2003 | Coccioli et al. |
| 6,587,327 | B1 | 7/2003 | Devoe et al. |
| 6,597,187 | B2 | 7/2003 | Eldridge et al. |
| 6,603,322 | B1 | 8/2003 | Boll et al. |
| 6,603,323 | B1 | 8/2003 | Miller et al. |
| 6,603,324 | B2 | 8/2003 | Eldridge et al. |
| 6,605,941 | B2 | 8/2003 | Abe |
| 6,605,951 | B1 | 8/2003 | Cowan |
| 6,605,955 | B1 | 8/2003 | Costello et al. |
| 6,606,014 | B2 | 8/2003 | Miller |

| | | | | | | |
|---|---|---|---|---|---|---|
| 6,606,575 B2 | 8/2003 | Miller | | 6,778,406 B2 | 8/2004 | Eldridge et al. |
| 6,608,494 B1 | 8/2003 | Bruce et al. | | 6,780,001 B2 | 8/2004 | Eldridge et al. |
| 6,611,417 B2 | 8/2003 | Chen | | 6,784,674 B2 | 8/2004 | Miller |
| 6,615,485 B2 | 9/2003 | Eldridge et al. | | 6,784,677 B2 | 8/2004 | Miller |
| 6,616,966 B2 | 9/2003 | Mathieu et al. | | 6,784,679 B2 | 8/2004 | Sweet et al. |
| 6,617,862 B1 | 9/2003 | Bruce | | 6,788,093 B2 | 9/2004 | Aitren et al. |
| 6,617,866 B1 | 9/2003 | Ickes | | 6,788,094 B2 | 9/2004 | Khandros et al. |
| 6,621,082 B2 | 9/2003 | Morita et al. | | 6,791,176 B2 | 9/2004 | Mathieu et al. |
| 6,621,260 B2 | 9/2003 | Eldridge et al. | | 6,794,888 B2 | 9/2004 | Kawaguchi et al. |
| 6,621,103 B1 | 9/2003 | Miller | | 6,794,934 B2 | 9/2004 | Betti-Berutto et al. |
| 6,624,648 B2 | 9/2003 | Eldridge et al. | | 6,794,950 B2 | 9/2004 | Du Toit et al. |
| 6,627,461 B2 | 9/2003 | Chapman et al. | | 6,798,225 B2 | 9/2004 | Miller |
| 6,627,483 B2 | 9/2003 | Ondricek et al. | | 6,798,226 B2 | 9/2004 | Altmann et al. |
| 6,627,980 B2 | 9/2003 | Eldridge | | 6,806,724 B2 | 10/2004 | Hayden et al. |
| 6,628,503 B2 | 9/2003 | Sogard | | 6,806,836 B2 | 10/2004 | Ogawa et al. |
| 6,628,980 B2 | 9/2003 | Atalar et al. | | 6,807,734 B2 | 10/2004 | Eldridge et al. |
| 6,633,174 B1 | 10/2003 | Satya et al. | | 6,809,533 B1 | 10/2004 | Anlage et al. |
| 6,636,182 B2 | 10/2003 | Mehltretter | | 6,811,406 B2 | 11/2004 | Grube |
| 6,639,461 B1 | 10/2003 | Tam et al. | | 6,812,691 B2 | 11/2004 | Miller |
| 6,640,415 B2 | 11/2003 | Eslamy et al. | | 6,812,718 B1 | 11/2004 | Chong et al. |
| 6,640,432 B1 | 11/2003 | Mathieu et al. | | 6,815,963 B2 | 11/2004 | Gleason et al. |
| 6,642,625 B2 | 11/2003 | Dozier, II et al. | | 6,816,031 B1 | 11/2004 | Miller |
| 6,643,597 B1 | 11/2003 | Dunsmore | | 6,816,840 B1 | 11/2004 | Goodwin, III |
| 6,644,982 B1 | 11/2003 | Ondricek et al. | | 6,817,052 B2 | 11/2004 | Grube |
| 6,646,520 B2 | 11/2003 | Miller | | 6,818,840 B2 | 11/2004 | Khandros |
| 6,653,903 B2 | 11/2003 | Leich et al. | | 6,822,463 B1 | 11/2004 | Jacobs |
| 6,655,023 B1 | 12/2003 | Eldridge et al. | | 6,822,529 B2 | 11/2004 | Miller |
| 6,657,455 B2 | 12/2003 | Eldridge et al. | | 6,825,052 B2 | 11/2004 | Eldridge et al. |
| 6,657,601 B2 | 12/2003 | McLean | | 6,825,422 B2 | 11/2004 | Eldridge et al. |
| 6,661,316 B2 | 12/2003 | Hreish et al. | | 6,827,584 B2 | 12/2004 | Mathieu et al. |
| 6,664,628 B2 | 12/2003 | Khandros et al. | | 6,835,898 B2 | 12/2004 | Eldridge et al. |
| 6,669,489 B1 | 12/2003 | Dozier, II et al. | | 6,836,962 B2 | 1/2005 | Khandros et al. |
| 6,672,875 B1 | 1/2004 | Mathieu et al. | | 6,838,885 B2 | 1/2005 | Kamitani |
| 6,677,744 B1 | 1/2004 | Long | | 6,838,893 B2 | 1/2005 | Khandros et al. |
| 6,678,850 B2 | 1/2004 | Roy et al. | | 6,839,964 B2 | 1/2005 | Henson |
| 6,678,876 B2 | 1/2004 | Stevens et al. | | 6,845,491 B2 | 1/2005 | Miller et al. |
| 6,680,659 B2 | 1/2004 | Miller | | 6,850,082 B2 | 2/2005 | Schwindt |
| 6,685,817 B1 | 2/2004 | Mathieu | | 6,856,129 B2 | 2/2005 | Thomas et al. |
| 6,686,754 B2 | 2/2004 | Miller | | 6,856,150 B2 | 2/2005 | Sporck et al. |
| 6,690,185 B1 | 2/2004 | Khandros et al. | | 6,862,727 B2 | 3/2005 | Stevens |
| 6,701,265 B2 | 3/2004 | Hill et al. | | 6,864,105 B2 | 3/2005 | Grube et al. |
| 6,701,612 B2 | 3/2004 | Khandros et al. | | 6,864,694 B2 | 3/2005 | McTigue |
| 6,707,548 B2 | 3/2004 | Kreimer et al. | | 6,870,359 B1 | 3/2005 | Sekel |
| 6,708,403 B2 | 3/2004 | Beaman et al. | | 6,870,381 B2 | 3/2005 | Grube |
| 6,710,798 B1 | 3/2004 | Hershel et al. | | 6,882,239 B2 | 4/2005 | Miller |
| 6,713,374 B2 | 3/2004 | Eldridge et al. | | 6,882,546 B2 | 4/2005 | Miller |
| 6,714,828 B2 | 3/2004 | Eldridge et al. | | 6,887,723 B1 | 5/2005 | Ondricek et al. |
| 6,717,426 B2 | 4/2004 | Iwasaki | | 6,888,362 B2 | 5/2005 | Eldridge et al. |
| 6,720,501 B1 | 4/2004 | Henson | | 6,891,385 B2 | 5/2005 | Miller |
| 6,722,032 B2 | 4/2004 | Beaman et al. | | 6,900,646 B2 | 5/2005 | Kasukabe et al. |
| 6,724,205 B1 | 4/2004 | Hayden et al. | | 6,900,647 B2 | 5/2005 | Yoshida et al. |
| 6,724,928 B1 | 4/2004 | Davis | | 6,900,652 B2 | 5/2005 | Mazur |
| 6,727,579 B1 | 4/2004 | Eldridge et al. | | 6,900,653 B2 | 5/2005 | Yu et al. |
| 6,727,580 B1 | 4/2004 | Eldridge et al. | | 6,902,416 B2 | 6/2005 | Feldman |
| 6,727,716 B1 | 4/2004 | Sharif | | 6,902,941 B2 | 6/2005 | Sun |
| 6,729,019 B2 | 5/2004 | Grube et al. | | 6,903,563 B2 | 6/2005 | Yoshida et al. |
| 6,731,804 B1 | 5/2004 | Carrieri et al. | | 6,906,506 B1 | 6/2005 | Reano et al. |
| 6,734,687 B1 | 5/2004 | Ishitani et al. | | 6,906,539 B2 | 6/2005 | Wilson et al. |
| 6,737,920 B2 | 5/2004 | Jen et al. | | 6,906,542 B2 | 6/2005 | Sakagawa et al. |
| 6,741,085 B1 | 5/2004 | Khandros et al. | | 6,906,543 B2 | 6/2005 | Lou et al. |
| 6,741,092 B2 | 5/2004 | Eldridge et al. | | 6,907,149 B2 | 6/2005 | Slater |
| 6,741,129 B1 | 5/2004 | Corsi et al. | | 6,908,364 B2 | 6/2005 | Back et al. |
| 6,744,268 B2 | 6/2004 | Hollman | | 6,909,297 B2 | 6/2005 | Ji et al. |
| 6,753,679 B1 | 6/2004 | Kwong et al. | | 6,909,300 B2 | 6/2005 | Lu et al. |
| 6,753,699 B2 | 6/2004 | Stockstad | | 6,909,983 B2 | 6/2005 | Sutherland |
| 6,759,311 B2 | 7/2004 | Eldridge et al. | | 6,910,268 B2 | 6/2005 | Miller |
| 6,759,859 B2 | 7/2004 | Deng et al. | | 6,911,814 B2 | 6/2005 | Miller et al. |
| 6,764,869 B2 | 7/2004 | Eldridge et al. | | 6,911,826 B2 | 6/2005 | Plotnikov et al. |
| 6,768,328 B2 | 7/2004 | Self et al. | | 6,911,834 B2 | 6/2005 | Mitchell et al. |
| 6,770,955 B1 | 8/2004 | Coccioli et al. | | 6,911,835 B2 | 6/2005 | Chraft et al. |
| 6,771,806 B1 | 8/2004 | Satya et al. | | 6,912,468 B2 | 6/2005 | Marin et al. |
| 6,777,319 B2 | 8/2004 | Grube et al. | | 6,913,468 B2 | 7/2005 | Dozier, II et al. |
| 6,778,140 B1 | 8/2004 | Yeh | | 6,914,244 B2 | 7/2005 | Alani |

| | | |
|---|---|---|
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sugiyama et al. |
| 7,332,923 B2 | 2/2008 | Schott et al. |
| 7,342,402 B2 | 3/2008 | Kim et al. |
| 7,403,028 B2 | 7/2008 | Campbell |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |

| | | | |
|---|---|---|---|
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gunderson et al. |
| 2003/0184332 A1 | 10/2003 | Tomimatsu et al. |
| 2003/0215966 A1 | 11/2003 | Rolda et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0195124 A1 | 9/2005 | Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |

| | | |
|---|---|---|
| 2007/0030021 A1 | 2/2007 | Cowan et al. |

FOREIGN PATENT DOCUMENTS

| | | |
|---|---|---|
| CN | 1083975 | 3/1994 |
| DE | 3426565 | 1/1986 |
| DE | 3637549 | 5/1988 |
| DE | 4223658 | 1/1993 |
| DE | 19522774 | 1/1997 |
| DE | 19542955 | 5/1997 |
| DE | 19618717 | 1/1998 |
| DE | 19749687 | 5/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0 945 736 | 9/1999 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 58-130602 | 8/1983 |
| JP | 594189 U | 1/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |

| | | |
|---|---|---|
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| RU | 1392603 | 4/1988 |
| SU | 843040 | 6/1981 |
| SU | 1195402 | 11/1985 |
| WO | WO80/00101 | 1/1980 |
| WO | WO94/10554 | 5/1994 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

AndrzejW. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Cohn, S, "Properties of Ridge Wave Guide," Proceedings of the I.R.E., Aug. 1947, pp. 783-788.

Cohn, Seymour B., "Optimum Design of Stepped Transmission-Line Transformers," I.R.E. Transactions—Microwave Theory and Techniques, No. 3, 1955, pp. 16-21.

Hopper, Samuel, "The Design of Ridged Waveguides," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. MII-16, No. 12, Dec. 1968, pp. 1007-1017.

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentaton and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF)," MT950 Series, Sep. 20, 1982, 2 pages.

Maury Microwave Corp., "Transistor Test Fixture (TTF)," MT950 Series, Advanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.

Adamian, V. et al., "Simplified Noise Evaluation of Microwave Receiver," IEEE Transactions on Instrumentation and Measurement, vol. IM-33, No. 2, Jun. 1984, 136-140.

Pastori, William E., "High accuracy microwave noise figure measurements," 8029 Electronic Engineering 56, No. 1984, pp. 181-189.

Inter-Continental Microwave, "Product Catalog," VMC 1055 Jan. 1986.

Design Technique, "Microstrip Microwave Test Fixture," May 1986.

Cascade Microtech, Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolar Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products," Sep. 1988, pp. 297.

Cascade Microtech Microprobe Update, "Spurious propagation, modes removed by probe absorber," Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.
International Search Report for PCT/US2005/039561, mailed May 18, 2006.
Written Opinion of the International Searching Authority for PCT/US2005/039561, mailed May 18, 2006.

Bob Stengel, "Neutralized Differential Amplifiers using Mixed-Mode s-parameters," 2003 IEEE Radio Frequency Integrated Circuits Symposium, pp. 711-714.

FIG. 5

PROBE HOLDER FOR TESTING OF A TEST DEVICE

CROSS-REFERENCE TO RELATED APPLICATIONS

This application is a continuation of U.S. patent application Ser. No. 11/406,737, filed Apr. 18, 2006, now U.S. Pat. No. 7,221,174; which is a continuation of U.S. patent application Ser. No. 10/954,496, filed Sep. 29, 2004, now U.S. Pat. No. 7,057,407; which is a continuation of U.S. patent application Ser. No. 10/278,313, filed Oct. 22, 2002, now U.S. Pat. No. 6,850,082, which is a continuation of patent application Ser. No. 10/086,331, filed Mar. 1, 2002, now U.S. Pat. No. 6,496,024, which is a continuation of U.S. patent application Ser. No. 09/815,182, filed Mar. 22, 2001, now U.S. Pat. No. 6,384,615, which is a division of U.S. patent application Ser. No. 08/864,287, filed May 28, 1997, now U.S. Pat. No. 6,232,789.

BACKGROUND OF THE INVENTION

The present invention relates to a probe holder suitable for low current measurements.

Typically, in the construction of a probe card, a dielectric board is used as a base. A plurality of probing devices are mounted in a radial arrangement about an opening in the board so that the probing elements of these devices, which may, for example comprise slender conductive needles, terminate below the opening in a pattern suitable for probing the contact sites of the test device. The probing devices are individually connected to the respective channels of a test instrument by a plurality of interconnecting lines, where the portion of each line that extends between the corresponding probing device and the outer edge of the dielectric board may comprise an interconnecting cable or a conductive trace pattern formed directly on the board. In one conventional type of setup where the test devices are integrated circuits formed on a semiconductor wafer, the probe card is mounted by a supporting rig or test head above the wafer, and a support beneath the wafer moves the wafer so that each device thereon is consecutively brought into contact with the needles or probing elements of the probe card.

With particular regard to probe cards that are specially adapted for use in measuring ultra-low current (down to the femtoamp region or lower), probe card designers have been concerned with developing techniques for eliminating or at least reducing the effects of leakage currents, which are unwanted currents that can flow into a particular cable or channel from surrounding cables or channels so as to distort the current measured in that particular cable or channel. For a given potential difference between two spaced apart conductors, the amount of leakage current that will flow between them will vary depending upon the volume resistivity of the insulating material that separates the conductors, that is, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing inter-channel leakage currents is surrounding the inner core of each lead-in wire with a cylindrical "guard" conductor, where the "guard" conductor is maintained at the same potential as the inner core by a feedback circuit in the output channel of the test instrument. Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors, unlike the inner conductive cores, are at low impedance. By using this guarding technique, significant improvement may be realized in the low-level current measuring capability of certain probe card designs.

To further improve low-current measurement capability, probe cards have been constructed so as to minimize leakage current between the individual probing devices which mount the probing needles or other elements. With respect to these devices, higher-resistance insulating materials have been substituted for lower resistance materials and additional conductive surfaces have been arranged about each device in order to perform a guarding function in relation thereto. In one type of assembly, for example, each probing device is constructed using a thin blade of ceramic material, which is a material known to have a relatively high volume resistivity. An elongate conductive trace is provided on one side of the blade to form the signal line and a backplane conductive surface is provided on the other side of the blade for guarding purposes. The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in a radial arrangement about the opening in the card so that the needles terminate within the opening in a pattern suitable for probing the test device. The conductive backplane on each blade is connected to the guard conductor of the corresponding cable and also the corresponding conductive pad or "land" adjacent the opening in the card. In this manner each conductive path is guarded by the backplane conductor on the opposite side of the blade and by the conductive land beneath it.

It has been found, however, that even with the use of guarded cables and ceramic probing devices of the type just described, the level of undesired background current is still not sufficiently reduced as to match the capabilities of the latest generation of commercially available test instruments, which instruments are able to monitor currents down to one femtoamp or less. Thus, it was evident that other changes in probe card design were needed in order to keep up with the technology of the latest test instrument design.

Figures 1, 2:
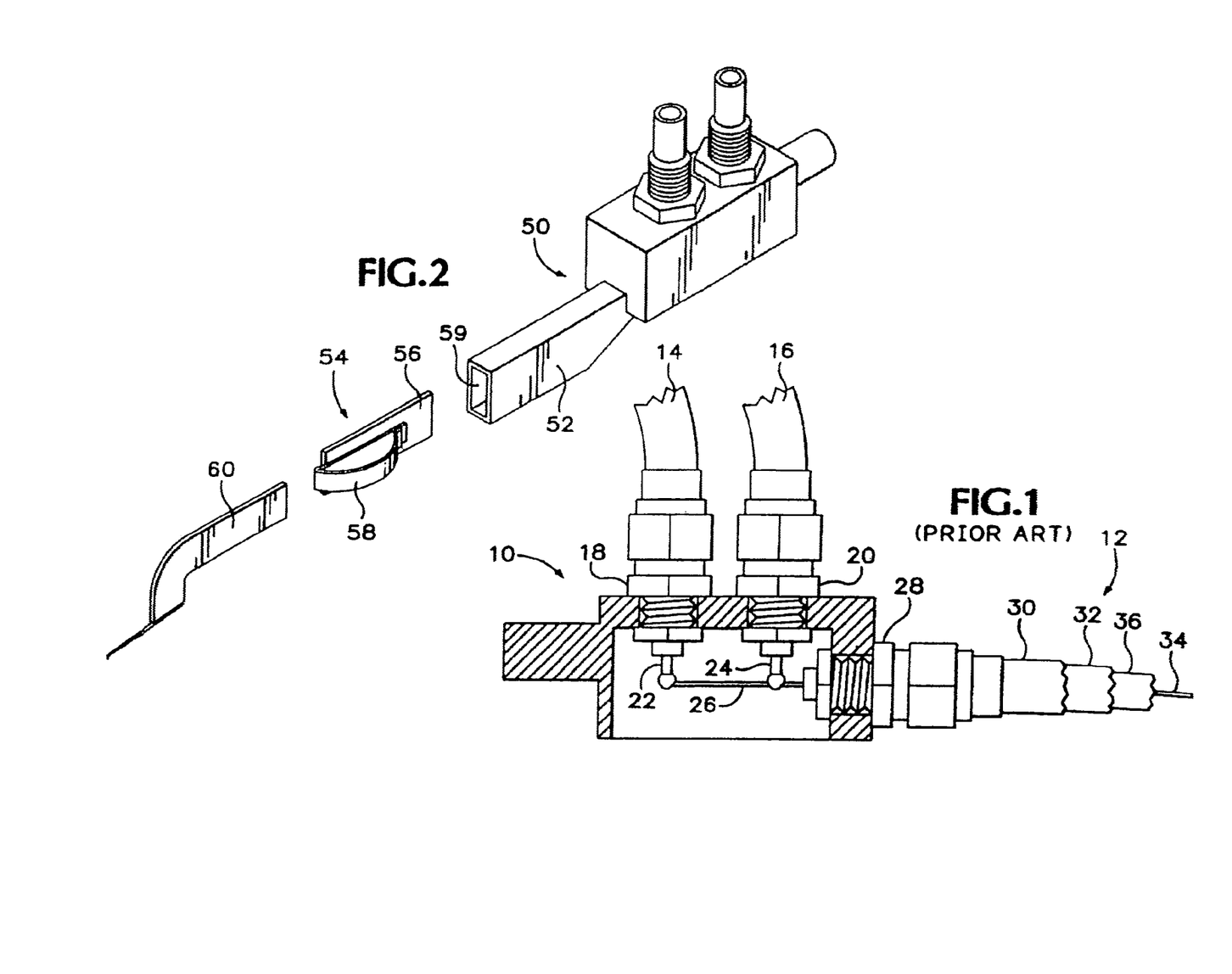
FIG. 1 is a sectional view of a conventional probe housing and cable type probing device.
FIG. 2 is a pictorial view of an exemplary embodiment of a probe housing with a probe connector, and probing device of the present invention.

However, in the design of such probe cards the ceramic blades are permanently mounted to the probe card and thus when damaged the entire probe card may need to be replaced or the damaged ceramic blade somehow repaired at substantial expense and effort. Referring to FIG. 1, in order to provide probe tips that are more easily replaced, a probe housing 10 with a replaceable probe tip 12 was designed. A pair of triaxial cables (not shown), each of which includes a shield, a guard, and a signal conductor, extend from measurement equipment (not shown) to a location within a chamber (not shown) that encloses the probe tip 12, the probe housing 10, and the test device. Each triaxial cable is connected to a respective coaxial cable 14 and 16 that includes a guard and a signal conductor. The shield conductor of each of the triaxial cables may be connected to the chamber, if desired. The chamber environment is shielded so it is unnecessary to include the shield conductors all the way to the probe housing 10. In addition, the probe housing 10 includes relatively small connectors which are much more suitable for connection to relatively small coaxial cables 14 and 16, as opposed to relatively large triaxial cables. The probe housing 10 includes a pair of connectors 18 and 20, each of which provides a connection to a respective one of the coaxial cables 14 and 16. The guard of each of the coaxial cables 14 and 16 is electrically connected to the conductive exterior of the probe housing 10, which reduces the capacitance and leakage currents to the probe tip 12.

Ideally in a two lead coaxial cable system a "true Kelvin" connection is constructed, although not shown in FIG. 1. This involves using what is generally referred to as a force signal and a sense signal. The signal conductor from one of the coaxial cables is considered the force conductor, while the signal conductor from the other coaxial cable is considered the sense conductor. The force conductor is brought into contact with a test pad on the wafer. The force conductor is a low impedance connection, so a current is forced through the force conductor for testing purposes. The sense conductor is a high impedance connection and is also brought into contact with the same test pad on the wafer, preferably in close proximity to the sense conductor, in order to sense the voltage. As such the current versus voltage characteristics of the test device can be obtained using the force and sense conductors.

To calibrate the "true Kelvin" connection, first an open circuit test is performed to measure the capacitance without the test pad capacitance. This is performed by picking up the probe and shorting the probe tips of the sense and force conductors together with both suspended in air. The open circuit test is difficult to perform. Second, a short circuit test is performed to measure the capacitance when the force and sense conductor tips are on the test pad. From the open circuit test and the short circuit test the cable impedance is obtained and thereafter used for offsetting during subsequent measurements. Unfortunately, calibration of a "true Kelvin" connection is difficult and time consuming to perform. Additionally, the current flowing through the force conductor is generally known but the resistance drop along the length of force conductor results in the exact voltage at its end to be unknown, therefore the measurement can be inaccurate. Further, the test pads on the test device are normally small, in order to minimize cost, which makes it difficult to position two needles on the test pad. Furthermore, using two needles requires additional space for the needles and supporting structure that may not be available when a large number of probe needles are simultaneously necessary to test a small area of the test device, such as a silicon wafer.

Referring again to FIG. 1, to permit the use of a single probe tip, which permits more tests to be simultaneously performed in a confined area, the force conductor 22 and the sense conductor 24 are electrically connected together with a combined conductor 26 within the probe housing 10. Coaxial cable 14 would be the force connection while cable 16 would be the sense connection. The guard conductor of the force cable 14 and the guard conductor of the sense cable 16 are electrically connected to the conductive probe housing 10. The combined force and sense conductor 26 is electrically connected to a probe connector 28 at one end of the probe housing 10. A rigid coaxial probe tip cable 30 is detachably connected to the probe connector 28. The rigid coaxial probe tip cable 30 includes both a copper guard conductor 32 plated with gold and a central signal conductor 34 made of tungsten. The guard conductor 32 of the rigid coaxial probe tip cable 30 is electrically connected to the probe housing 10, which is in turn connected to the guard conductors of the coaxial cables 14 and 16. The length of the signal path extending from the point that the force conductor 22 and sense conductor 24 are connected together carries current during measurements which results in a voltage drop from any internal resistance in that portion of the signal path. The assumption is that for low current applications, the voltage drop due to the resistance is small because the junction is close to the probe tip 12 and the conductor has low resistance. However, the rigid coaxial probe tip cable 30 is difficult to replace if defective or damaged during use. The test device shown in FIG. 1, provides reasonably accurate low current measurements. Unfortunately, it was observed that the device shown in FIG. 1, when used over a wide range of temperatures, such as −65 degrees celsius to 300 degree celsius, results in unacceptable levels of noise. For example, in one commercial embodiment, noise in the range of +−100 femtoamps was observed over only a temperature range from room temperature to 150 degrees celsius. As previously mentioned, modern measurement instruments are capable of measuring much lower current levels and thus such noise levels obscures low current measurement levels under 10 femtoamps.

What is desired, therefore, is a low current measurement device that has substantially lower noise levels. In addition, such a measurement device should be provide for easy replacement of probe tips.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

After observing excessive noise levels over wide temperature ranges resulting from the device shown in FIG. 1, the present inventor came to the startling realization that a Teflon insulator 36 between the signal conductor 34 and the guard conductor 32 of the coaxial probe tip cable 30 expands and contracts when the temperature is increased and decreased, respectfully. The expansion and contraction of the Teflon insulator 36 results in relative movement and friction with respect to the signal conductor 34 and the guard conductor 32. The relative movement generates electrical charges between both the guard conductor 32 and the signal conductor 34 in contact with the Teflon insulator 36 due to friction. Free electrons rub off the signal conductor 32 and the guard conductor 34 which creates a charge imbalance resulting in a current flow.

Triboelectric currents are traditionally considered to arise in relation to the physical bending of materials, such as coaxial cables. The time during which the coaxial cable undergoes physical bending is relatively long, e.g. low frequency, and does not significantly contribute to the triboelectric current generation. The present inventor believes that instead of the physical bending resulting in the major source of the generation of triboelectric currents, it is in fact a much more subtle phenomena involving the slight contraction and expansion of the Teflon insulator that creates the frictional movement previously described, and hence the undesired triboelectric current generation.

With the identification of the source of the noise, which had not been previously identified by previous probe card designers, the present inventor developed ingenious solutions to the identified problem.

In order to reduce the triboelectric current generation, the cable 30 is replaced with "low-noise" cable. "Low-noise" cable greatly reduces triboelectric currents by typically using an inner insulator of polyethylene coated with graphite. The graphite provides lubrication and a conduction equipotential cylinder to equalize charges and minimize charges generated by frictional effects of cable movement.

It will be noted that the inventor does not claim to have discovered a new solution to the problem of the triboelectric effect as embodied by the use of "low-noise" cable. A relatively straightforward solution to this problem can be found in the field of cable technology wherein it is known how to construct a "low-noise" cable by using an additional layer of material between the outer conductor and the inner insulator, which material is of suitable composition for suppressing the triboelectric effect. This layer, in particular, includes a non-metallic portion that is physically compatible with the inner insulator so as to be prevented from rubbing excessively against this dielectric and, on the other hand, includes a portion that is sufficiently conductive that it will immediately dissipate any charge imbalance that may be created by free electrons that have rubbed off the conductor. It is not claimed by the inventor that this particular solution to the triboelectric effect problem is his invention. Rather it is the recognition that this specific problem is a major source of performance degradation in the field of low-current probe station design, and in particular degradation when testing over a range of temperatures, that the inventor regards as his discovery.

As previously described, one embodiment of a probe holder design of the present invention includes the replacement of cable 30 with a "low-current" cable that includes conductive and dielectric layers in a coaxial arrangement with each other and further includes at least one layer of material within each cable adapted for suppressing the triboelectric effect so as to minimize any undesirable currents that would otherwise be generated internally in each cable due to this effect. This layer of material on the probe holder enables the probe station to be used for the measurement of ultra-low currents even over a range of temperatures.

In the field of radio frequency (rf) cable technology, cables that include a layers material of the type just described are generally referred to as "low-noise" cables. Commercial sources for this type of cable include Belden Wire and Cable Company based in Richmond, Ind., Suhner HR-Kabel based in Herisau, Switzerland, and Times Microwave Systems based in Wallingford, Conn.

While the replacement of the cable 30 with "low-noise" cable significantly enhances the low-noise characteristics of the device 10, the cable is expensive to obtain in small quantities, awkward to replace in a confined environment if damaged, and the precise bending of the cable to the test pad together with the precise location of the probe tip is difficult to control with a cable type connector. Even more importantly, the Teflon insulator material in coaxial cables are susceptible to "cold flow" out of the end of the cable when subjected to significant temperatures. The resulting cable insulator will be thinner in portions thereby changing the characteristics of the cable over time.

Referring to FIG. 2, in order to overcome the limitations of cable type connectors, an alternative embodiment includes a conductive probe housing 50, similar in structure to the probe housing 10 shown in FIG. 1, with an elongate probe connector 52. The probe connector 52 is conductive and preferably has a rectangular cross section. An insert 54 is sized to fit within the probe connector 52. The insert 52 includes a ceramic insulator 56 and a conductive bent connector 58 attached to one side of the insulator 56. The insulator 56 is in face-to-face abutment with the interior upright surface 59 of the probe connector 52. A "blade" type probe 60, as described in the background, is matingly detachably engageable within the probe connector 52.

Figures 3, 4:
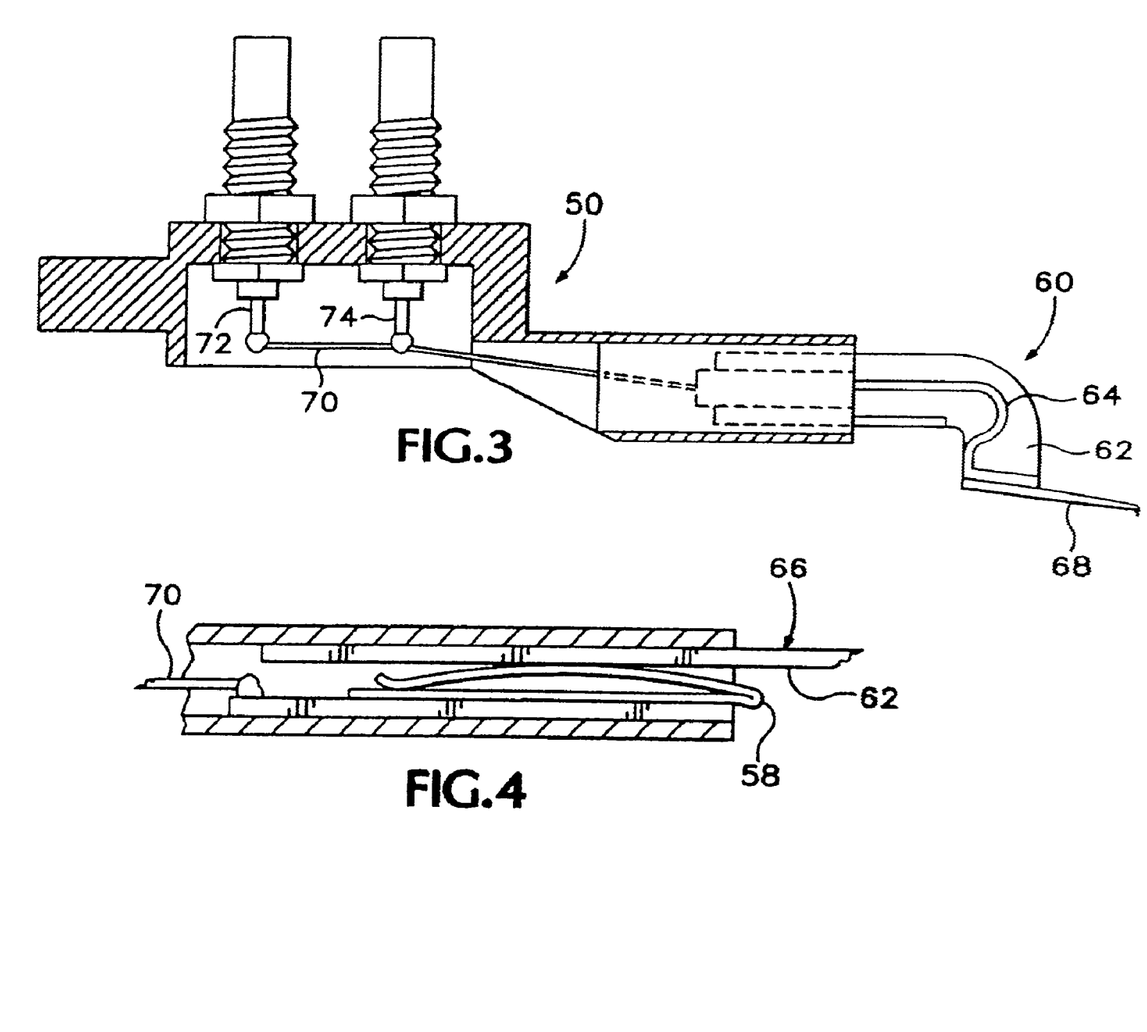
FIG. 3 is a sectional view of the probe housing and probing device engaged within the probe connector of FIG. 1.
FIG. 4 is a sectional view of the probe connector and probing device of FIG. 1.
Figure 5:
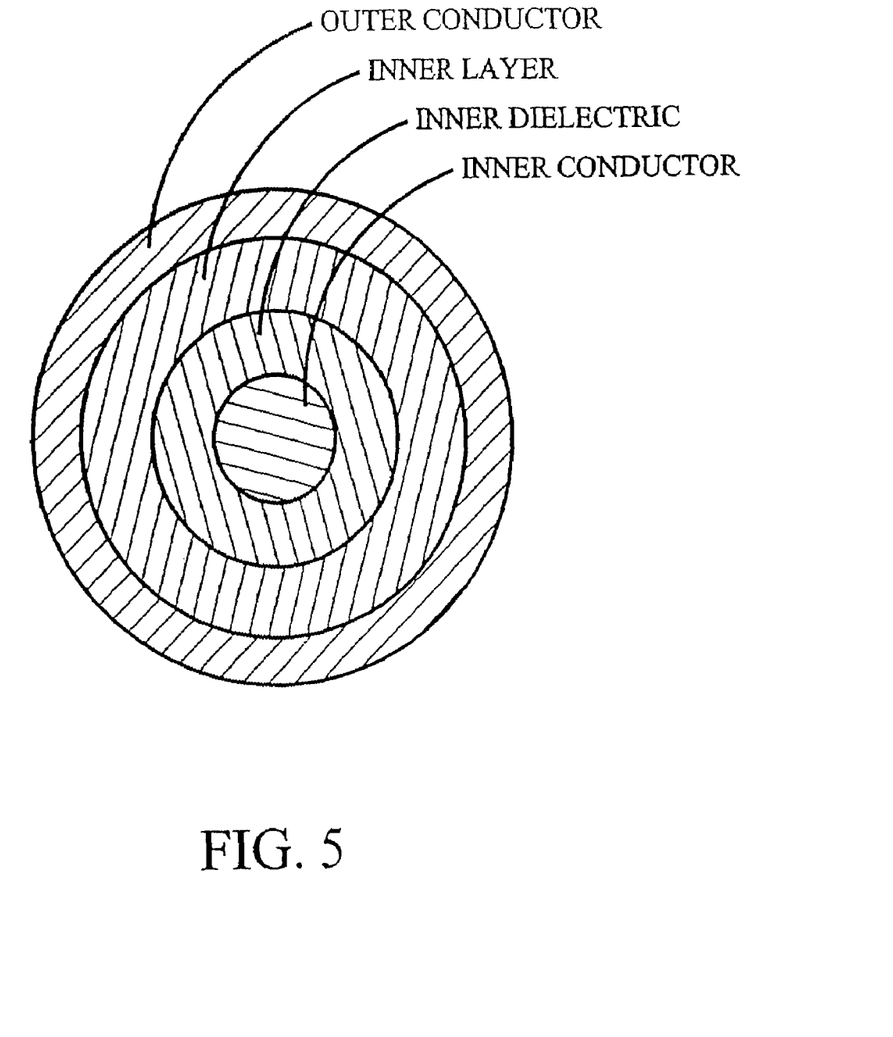
FIG. 5 is an exemplary low-noise cable.

Referring also to FIG. 3, the blade 60 preferably includes a dielectric substrate 62 formed of a ceramic or a comparable high-resistance insulating material. The blade 60 has a pair of broad parallel sides or faces interconnected by a thin edge. Formed on one side of the blade 60 is an elongate conductive path 64, while the other side includes a backplane conductive surface 66. A needle 68 is supported by the dielectric substrate 62 and electrically connected to the elongate conductive path 64. In the particular embodiment shown, the blade 60 is generally L-shaped in profile and is edge-mounted within the probe connector 52 so that the short arm of the L-shaped blade 60 extends downwardly making contact with the test device. As previously indicated, blades 60 having a construction of the type just described are commercially available from Cerprobe Corporation of Tempe, Ariz.

Referring also to FIG. 4, when the blade 60 is slidably engaged within the probe connector 52, the backplane conductive surface 66 is in face-to-face contact with the inner upright surface 59 of the probe connector 52. Accordingly, a ground signal path is provided from the guard conductors of the force and sense cables 14 and 16, though the probe housing 50 and probe connector 52 to the backplane conductive area 66 of the blade 60. This provides a ground path to a location near the end of the needle 68. In addition, a conductive path is provided from force and sense conductors 72 and 74 connected to cables 14 and 16, through a combined conductor 70 to the bent connector 58. It is to be understood that the combined connector 70 may be any suitable type of coupler that electrically connects the force and sense cables to the conductive path 64 on the blade 60. Likewise it is to be understood that the electrical connection between the backplane 66 on the blade 60 and the cables 14 and 16 may be any suitable type of coupler. The bent connector 58 is resiliently deformable as the blade 60 is inserted into the probe connector 52 and exerts pressure between the backplane conductive surface 66 and the upright surface 59 so a low loss connection is maintained. Also the pressure maintains the position of the blade 60 during use. Simultaneously, the bent connector 58 exerts pressure between the conductive path 64 and the bent connector 58 to provide a low loss connection. A signal path is thus provided through the needle 68, the conductive path 64, the bent connector 58, and the combined conductor 70 to the force conductor 72 and sense conductor 74.

The probe embodiment shown in FIGS. 2-4 does not include structure that is subject to the generation of triboelectric currents and further is free from materials that deform over a normal range of temperatures used during probing. In addition, the blades 60 are readily replaceable if damaged during use.

While the preferred embodiment of the present invention embodies a set of two cables 14 and 16, with one including the sense conductor and the other including the force conductor, it is to be understood that the present invention also encompasses a probe holder with a single coaxial, or triaxial, cable.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A system for probing a device under test comprising:
   (a) a probing device for probing said device under test, said probing device including a first conductive area, a second conductive area, a conductive elongate probing element connected to said first conductive area in a manner suitable to probe said device under test, and said first conductive area and said second conductive area electrically isolated from one another;
   (b) a probe housing detachably engageable with said probing device;
   (c) said probe housing being engaged with both a first cable that includes a first conductor surrounded by a second conductor and a second cable including a third conductor surrounded by a fourth conductor;
   (d) a first coupler electrically interconnects said first conductor, said third conductor, and said first conductive area when said probing device is engaged with said probe housing;
   (e) a second coupler electrically interconnects said second conductor and said fourth conductor with said second conductive area when said probing device is engaged with said probe housing.

2. The system of claim 1 wherein said probe housing further includes an elongate opening in which said probing device is matingly detachably engageable therewith.

3. The system of claim 2 wherein said second coupler includes a probe housing that defines an opening having a first upright surface therein.

4. The system of claim 3 wherein said conductive area is in face-to-face contact with said first upright surface when said probing device is engaged with said probe housing.

5. The system of claim 1 wherein said second coupler comprises a portion of said probe housing in contact with said second conductive area when said probing device is engaged with said probe housing.

6. A system for probing a device under test comprising:
   (a) a probing device for probing said device under test, said probing device including a first conductive area, a second conductive area, a conductive elongate probing element connected to said first conductive area in a manner suitable to probe said device under test, and said first conductive area and said second conductive area electrically isolated from one another;
   (b) a probe housing detachably engageable with said probing device;
   (c) a probe housing suitable for being detachably engageable with both a first cable that includes a first conductor surrounded by a second conductor and a second cable that includes a third conductor surrounded by a fourth conductor;
   (d) a first coupler electrically interconnects said first conductor, said third conductor, and said first conductive area when said probing device is engaged with said probe housing;
   (e) a second coupler electrically interconnects said second conductor, said fourth conductor, and said second conductive area when said probing device is engaged with said probe housing.

7. The system of claim 6 wherein said probe housing further includes an elongate opening in which said probing device is matingly detachably engageable therewith.

8. The system of claim 7 wherein said opening defines a first upright surface therein.

9. The system of claim 6 wherein said second coupler comprises a portion of said probe housing in contact with said second conductive area when said probing device is engaged with said probe housing.

10. A system for probing a device under test comprising:
    (a) a probing device for probing said device under test, said probing device including a first conductive area, a conductive elongate probing element connected to said first conductive area in a manner suitable to probe said device under test;
    (b) a probe housing detachably engageable with said probing device;
    (c) said probe housing suitable for being detachably engageable with at least a first cable that includes a first conductor surrounded by a second conductor;
    (d) a first coupler electrically interconnects said first conductor and said first conductive area when said probing device is engaged with said probe housing;
    (e) a second coupler electrically interconnects said second conductor with said first conductive area when said probing device is engaged with said probe housing.

11. The system of claim 10 wherein said probe housing further includes an elongate opening in which said probing device is matingly detachably engageable therewith.

12. The system of claim 11 wherein said opening defines a first upright surface therein.

* * * * *